United States Patent
Chen

(10) Patent No.: US 8,548,414 B2
(45) Date of Patent: Oct. 1, 2013

(54) CIRCUIT AND METHOD FOR REDUCING RADIO-FREQUENCY POWER CONSUMPTION OF MOBILE PHONE

(75) Inventor: Shouyan Chen, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 13/380,867

(22) PCT Filed: Jul. 5, 2010

(86) PCT No.: PCT/CN2010/074985
§ 371 (c)(1),
(2), (4) Date: Dec. 26, 2011

(87) PCT Pub. No.: WO2011/003341
PCT Pub. Date: Jan. 13, 2011

(65) Prior Publication Data
US 2012/0100897 A1    Apr. 26, 2012

(30) Foreign Application Priority Data
Jul. 9, 2009    (CN) .......................... 2009 1 0089237

(51) Int. Cl.
*H04B 1/10*    (2006.01)
(52) U.S. Cl.
USPC ..................... 455/311; 455/127.3; 455/194.2; 330/285
(58) Field of Classification Search
USPC .................... 455/311, 127.3, 194.2; 330/285
See application file for complete search history.

(56) References Cited

U.S. PATENT DOCUMENTS

| 7,110,724 B1* | 9/2006 | Epperson et al. ............... 455/72 |
| 2002/0094832 A1* | 7/2002 | Lee ................................ 455/522 |
| 2007/0057729 A1* | 3/2007 | Yamamoto et al. ........... 330/285 |
| 2008/0070520 A1 | 3/2008 | Mitter et al. |
| 2008/0171523 A1 | 7/2008 | Anderson et al. |

FOREIGN PATENT DOCUMENTS

| CN | 1272979 A | 11/2000 |
| CN | 101217748 A | 7/2008 |
| CN | 101414806 A | 4/2009 |
| CN | 101605388 A | 12/2009 |
| GB | 2455066 A | 6/2009 |

OTHER PUBLICATIONS

International Search Report for PCT/CN2010/074985 dated Sep. 29, 2010.

* cited by examiner

Primary Examiner — Danh Le
(74) Attorney, Agent, or Firm — Stephen Yang; Ling Wu; Ling and Yang Intellectual Property

(57) ABSTRACT

The invention discloses a circuit and a method for reducing radio frequency power consumption of mobile phone, wherein a baseband processing chip (21) adjusts a base bias voltage and/or a collector bias voltage of a radio frequency power amplifier (23) according to radio frequency power output of the radio frequency power amplifier (23). Since the invention reduces the radio frequency output power of the radio frequency power amplifier (23) by moderately reducing the base bias voltage and/or the collector bias voltage at the same time when it is ensured that the mobile phone communicates with a base station normally and the linear index and the Adjacent Channel Power Ratio (ACPR) of the radio frequency power amplifier (23) meet the requirements of the specification, thus the efficiency of the radio frequency power amplifier can be improved, the battery energy is saved and the heating problem of the mobile phone is relieved.

8 Claims, 4 Drawing Sheets

CIRCUIT AND METHOD FOR REDUCING RADIO-FREQUENCY POWER CONSUMPTION OF MOBILE PHONE

TECHNICAL FIELD

The invention relates to mobile communications technique, and especially, to a circuit and a method for reducing radio frequency power consumption of a mobile phone.

BACKGROUND OF THE RELATED ART

Code Division Multiple Access (CDMA)/Wideband Code Division Multiple Access (WCDMA) is the 3rd generation communication standard, which meets the high speed data transmission. In the CDMA/WCDMA system, the mobile phone is powered entirely depending on the battery. In order to meet the strict linear index and Adjacent Channel Power Ratio (ACPR) index defined in the IS95/3GPP spread spectrum standard, the mobile phone needs to adopt class A or class AB Radio Frequency (RF) power amplifier with high linearity. FIG. 1 is a schematic diagram of the typical RF power amplifier of the mobile phone in the CDMA/WCDMA system, and as shown in FIG. 1, the RF power amplifier needs two channels of supply voltages which are $V_{ref}$ and $V_{cc}$, wherein $V_{ref}$ provides the bias for the base of the power amplifier and $V_{cc}$ provides the bias for the collector of the power amplifier, both the base bias voltage $V_{ref}$ and the collector bias voltage $V_{cc}$ are constant values. When the max RF output power Po=28 dBm, the efficiency of this class of the RF power amplifier (RF power amplifier E) is just 35%, and when the RF output power is lower, the efficiency is lower. In practical applications, when in a speech mode, the RF power amplifier works in a continuous mode, that is because the working time of the mobile phone is 50% or ⅛ when the user is not in a call, and therefore, it is unnecessary to consider the heating problem of the mobile phone in the speech mode, however, in the data mode, the RF power amplifier keeps in a continuous working state all the time before ending the data transmission, the lower efficiency of the RF power amplifier and the continuous working state of RF power amplifier will consume a lot of battery capacity, and the internal power consumption produced by the consuming the battery capacity will make the mobile phone overheat.

SUMMARY OF THE INVENTION

In view of this, the main object of the invention is to provide a circuit and a method for reducing radio frequency power consumption of the mobile phone, which can save the battery capacity and relieve the heating problem of the mobile phone.

In order to achieve the above object, the technical scheme of the present invention is implemented as follows.

A circuit for reducing radio frequency power consumption of a mobile phone comprises: a baseband processing chip, a driver amplifier and a radio frequency power amplifier, wherein the baseband processing chip is used to output a base reference voltage to the driver amplifier according to radio frequency output power of the radio frequency power amplifier;

the driver amplifier is used to configure a gain for the base reference voltage output from the baseband processing chip, and then output the base reference voltage to a base of the radio frequency power amplifier;

the RF power amplifier is used to amplify a radio frequency input, and then output the radio frequency input that is amplified.

A circuit for reducing radio frequency power consumption of a mobile phone comprises: a battery, a baseband processing chip, a DC-DC module and a radio frequency power amplifier, wherein the battery is used to supply power for the DC-DC module;

the baseband processing chip is used to output an amplitude control signal of a collector voltage to the DC-DC module according to radio frequency output power of the radio frequency power amplifier;

the DC-DC module is used to implement DC-DC step-down conversion according to the amplitude control signal of the collector voltage from the baseband processing chip, and then output to a collector of the radio frequency power amplifier;

the radio frequency power amplifier is used to amplify a radio frequency input, and then output the radio frequency input that is amplified.

The baseband processing chip is further used to output a high power control signal to the DC-DC module;

the DC-DC module is further used to directly output a voltage that is supplied by the battery to the collector of the radio frequency power amplifier according to the high power control signal.

A circuit for reducing radio frequency power consumption of a mobile phone comprises: a baseband processing chip, a driver amplifier, a battery, a DC-DC module and a radio frequency power amplifier, wherein the baseband processing chip is used to output a base reference voltage to the driver amplifier according to radio frequency output power of the radio frequency power amplifier, and output an amplitude control signal of a collector voltage to the DC-DC module according to the radio frequency output power of the radio frequency power amplifier;

the driver amplifier is used to configure a gain for the base reference voltage output from the baseband processing chip, and then output the base reference voltage to a base of the radio frequency power amplifier;

the battery is used to supply power to the DC-DC module;

the DC-DC module is used to implement DC-DC step-down conversion on a voltage of the battery according to the amplitude control signal of the collector voltage from the baseband processing chip, then output the voltage of the battery to a collector of the radio frequency power amplifier;

the radio frequency power amplifier is used to amplify a radio frequency input, and then output the radio frequency input that is amplified.

The baseband processing chip is further used to output a high power control signal to the DC-DC module;

the DC-DC module is further used to directly output the voltage that is supplied by the battery to the collector of the radio frequency power amplifier according to the high power control signal.

A method for reducing radio frequency power consumption of a mobile phone comprises: a baseband processing chip adjusting a base bias voltage and/or a collector bias voltage of a radio frequency power amplifier according to radio frequency output power of the radio frequency power amplifier.

The baseband processing chip adjusting the base bias voltage of the radio frequency power amplifier according to the radio frequency output power of the radio frequency power amplifier comprises:

the baseband processing chip outputting a base reference voltage to a driver amplifier according to the radio frequency output power of the radio frequency power amplifier; and the driver amplifier configuring a gain for the base reference voltage output from the baseband processing chip, and outputting the base reference voltage to a base of the radio frequency power amplifier.

The baseband processing chip adjusting the collector bias voltage of the radio frequency power amplifier according to the radio frequency output power of the radio frequency power amplifier comprises:

the baseband processing chip outputting an amplitude control signal of a collector voltage to a DC-DC module according to the radio frequency output power of the radio frequency power amplifier; and the DC-DC module implementing DC-DC step-down conversion on a voltage of a battery according to the amplitude control signal of the collector voltage from the baseband processing chip, and then outputting the voltage of the battery to a collector of the radio frequency power amplifier.

A high power control threshold is configured, and the method further comprises: the baseband processing chip implementing high power control on the radio frequency power amplifier, which specifically comprises:

when a voltage of a battery is lower than the high power control threshold, the baseband processing chip outputting a high power control signal to a DC-DC module; and the DC-DC module directly outputting the voltage which is supplied by the battery to a collector of the radio frequency power amplifier according to the high power control signal.

The circuit and the method for reducing radio frequency power consumption of the mobile phone in the present invention adjust the base bias voltage and/or the collector bias voltage of the RF power amplifier of the mobile phone in real-time according to the RF output power of the RF power amplifier, thereby reducing the power consumption of the RF power amplifier. Since the invention reduces the RF output power of the RF power amplifier by moderately reducing the base bias voltage and/or collector bias voltage at the same time when it is ensured that the mobile phone communicates with a base station normally and the linear index and the ACPR of the RF power amplifier thereof meet the requirements of the specification, thus the efficiency of the RF power amplifier can be improved, the battery energy is saved and the heating problem of the mobile phone is relieved.

PREFERRED EMBODIMENTS OF THE PRESENT INVENTION

The basic idea of the present invention is to adjust the base bias voltage and/or collector bias voltage of the RF power amplifier in real time according to the RF output power of the RF power amplifier, thereby reducing the power consumption of the RF power amplifier.

The following description further describes the implementation of the technical scheme in detail with reference to drawings.

In the CDMA/WCDMA system, the RF output power of the RF power amplifier is not always maintained at the maximum, and in order to optimize the cellular capacity, that is, the traffic which can be processed by the base station simultaneously, each mobile phone needs to control its RF output power so that the base station can keep the same effective receiving signal noise ratio for each mobile phone. In a view from the probability distribution of the average RF output power of most mobile phones in the given region, the average RF output power of the CDMA/WCDMA mobile phone in suburban areas is +10 dBm, and the average RF output power of the CDMA/WCDMA mobile phone in urban areas is +5 dBm. Therefore, the goal of improving the efficiency of RF power amplifiers should be targeted at +5 dBm to +10 dBm rather than the maximum RF output power.

In the related art, when the RF output power is zero, typical values of $V_{ref}$ and $V_{cc}$ are: $V_{ref}$=3.0V and $V_{cc}$=3.4V, and the current consumed by the RF power amplifier itself is 100 mA. If $V_{ref}$ is reduced from 3.0V to 2.9V, the quiescent current will be reduced 20 mA. Thus, the quiescent current of the RF power amplifier can be effectively reduced by decreasing the $V_{ref}$.

Figure 1:
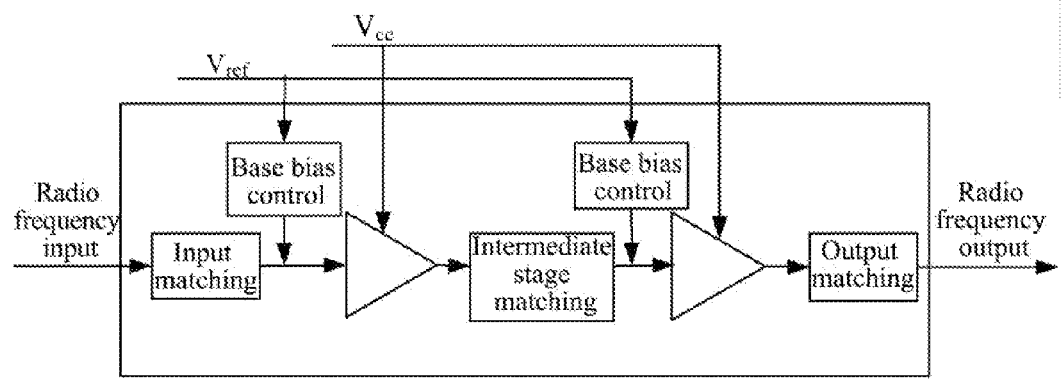
FIG. 1 is a schematic diagram of the typical RF power amplifier of the mobile phone in a CDMA/WCDMA System.
Figure 2:
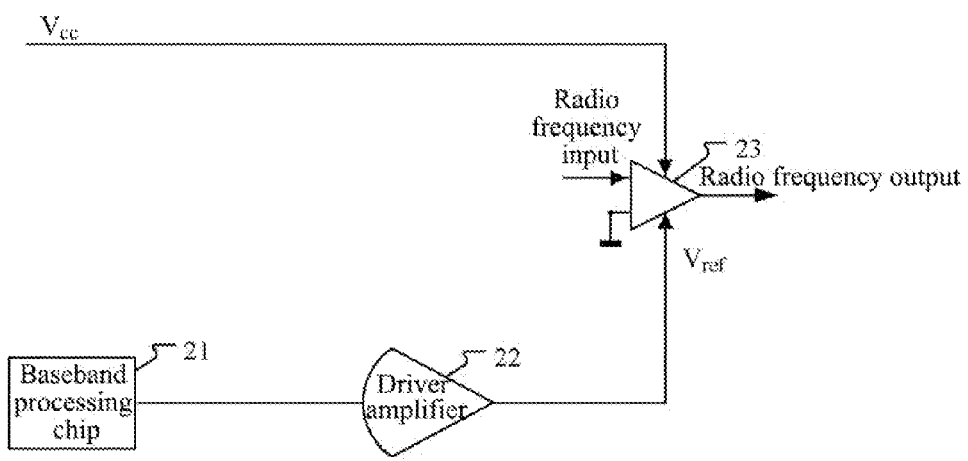
FIG. 2 is a structural schematic diagram of one circuit for reducing radio frequency power consumption of the mobile phone according to the invention.

FIG. 2 is a structural schematic diagram of the circuit for reducing radio frequency power consumption of the mobile phone according to the invention, and as shown in FIG. 2, the circuit for reducing radio frequency power consumption of the mobile phone according to the invention comprises: a baseband processing chip 21, a driver amplifier 22, and a RF power amplifier 23; wherein the baseband processing chip 21 is used to output the base reference voltage to the driver amplifier according to the RF output power of the RF power amplifier 23;

the driver amplifier 22 is used to configure a gain for the base reference voltage output from the baseband processing chip 21, and then output the base reference voltage to the base of the RF power amplifier 23;

the RF power amplifier 23 is used to amplify the radio frequency input, and then output the amplified radio frequency input.

Besides, in a typical mobile phone design, the $V_{cc}$ of the RF power amplifier is supplied by a single Li+ battery directly, and thus, the range of the $V_{cc}$ working voltage is from 3.2V to 4.2V.

As mentioned above, probability statistics indicates that the RF power amplifier of CDMA/WCDMA works at the RF output power from +5 dBm to +10 dBm most of the time, and the collector bias voltage $V_{cc}$ of the RF power amplifier can be reduced without decreasing the linear index of the RF power amplifier to achieve the object of reducing power consumption under such a power level.

Figure 3:
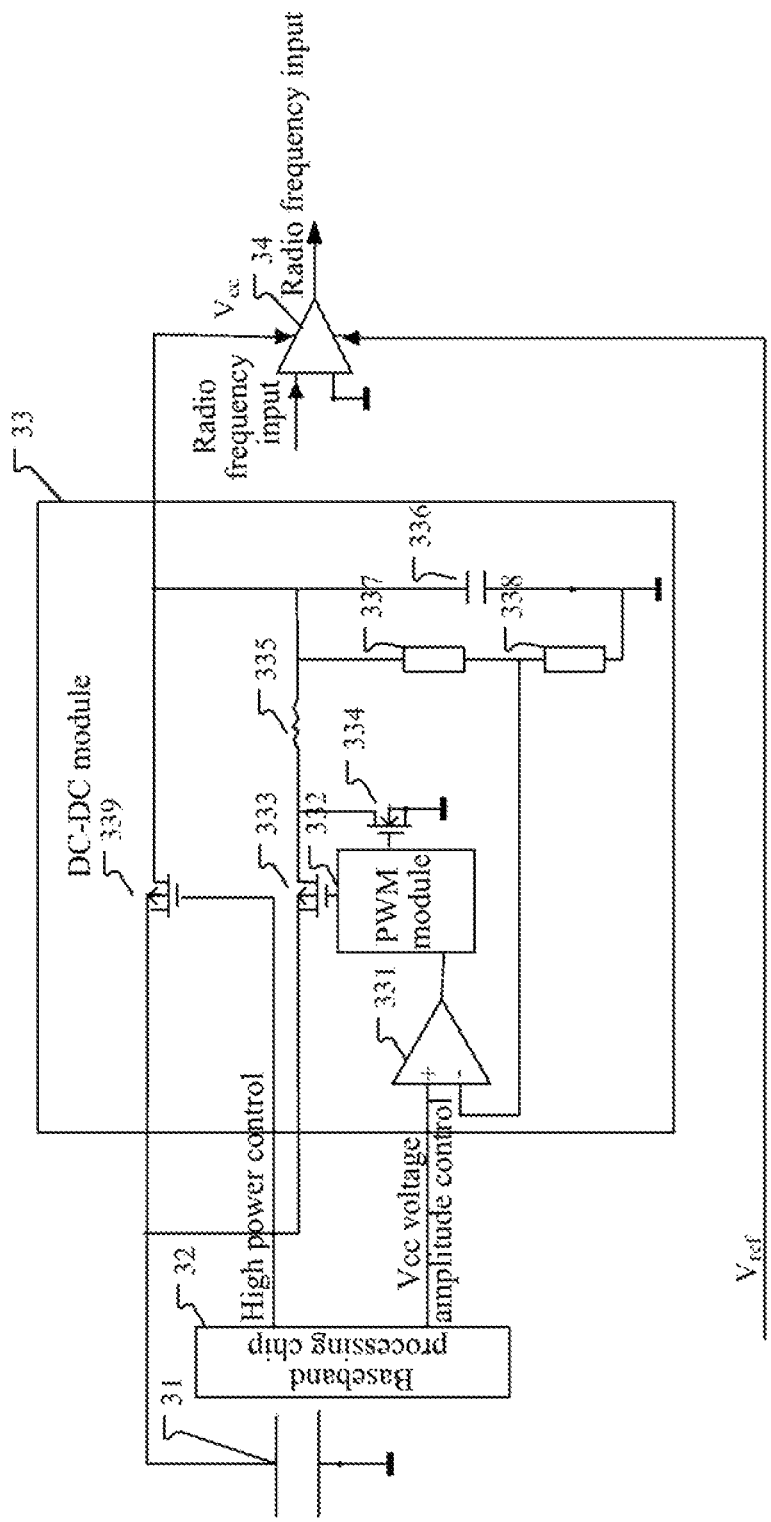
FIG. 3 is a structural schematic diagram of another circuit for reducing radio frequency power consumption of the mobile phone according to the invention.

FIG. 3 is a structural schematic diagram of another circuit for reducing radio frequency power consumption of mobile phone of the invention, as shown in FIG. 3, another circuit for reducing radio frequency power consumption of the mobile phone according to the invention comprises: a battery 31, a baseband processing chip 32, a DC-DC module 33 and a RF power amplifier 34, wherein the battery 31 is used to supply power for the DC-DC module;

the baseband processing chip 32 is used to output the amplitude control signal of the collector voltage to the DC-DC module 33 according to the RF output power of the RF power amplifier 34;

the DC-DC module 33 is used to implement DC-DC step-down conversion on the voltage of the battery 31 according to the amplitude control signal of the collector voltage which is from the baseband processing chip 32, and then output the voltage to the collector of the RF power amplifier 34.

As shown in FIG. 3, the DC-DC module 33 generally comprises: a differential amplifier 331, a Pulse Width Modulation (PWM) module 332, a P-channel metal oxide semiconductor-Field Effect Transistor (P-FET) 333 which is directly connected with the PWM module, a N-channel metal oxide semiconductor-Field Effect Transistor (N-FET) 334 which is directly connected with the PWM module, an energy storage inductor 335, a voltage stabilizing filtering capacitor 336, a resistor 337 and a resistor 338; wherein the baseband processing chip 32 specifically outputs the collector reference voltage to the in-phase input end of the differential amplifier 331; the output end of the differential amplifier 331 connects with the PWM module 332; the PWM module 332 connects with the gates of P-FET 333 and N-FET 334; the source of P-FET 333 connects with the battery 31, and the drain of P-FET 333 connects with one end of the energy storage inductor 335; the drain of N-FET 334 connects with the drain of P-FET 333, and the source of N-FET 334 is grounding; the other end of the energy storage inductor 335 connects with one end of the voltage stabilizing filtering capacitor 336, and the other end of the voltage stabilizing filtering capacitor 336 is grounding; the cascaded resistors 337 and 338 are connected at both ends of the voltage stabilizing filtering capacitor 336 in parallel, and the voltage between the resistor 337 and the resistor 338 is output to the anti-phase input end of the differential amplifier 331. The step-down conversion principle of the DC-DC module refers to the related art, which will not be described in detail herein.

The RF power amplifier 34 is used to amplify the radio frequency input, and then output the amplified radio frequency.

The baseband processing chip 32 is also used to output a high power control signal to the DC-DC module 33;

the DC-DC module 33 is also used to directly output the voltage which is supplied by the battery to the collector of the RF power amplifier 34 according to the high power control signal.

As shown in FIG. 3, in addition to the P-FET 333, the DC-DC module also comprises a P-FET 339, of which the gate connects with the baseband processing chip 32 and the source connects with the battery 31. Generally, a high power control threshold is configured in a mobile phone, and when the voltage of the battery 31 is lower than the high power control threshold, the baseband processing chip 32 outputs a high power control signal to the P-FET 339 and the P-FET 339 is in a conducting state, and thereby directly outputting the voltage which is supplied by the battery to the collector of the RF power amplifier 34; when the voltage of the battery 31 is not lower than the high power control threshold, the baseband processing chip 32 will not output the high power control signal to the P-FET 339 and the P-FET 339 is cutoff, and therefore, the voltage which is supplied by the battery 31 will be performed the step-down conversion and then output to the collector of RF power amplifier 34.

Of course, the base bias voltage and collector bias voltage can also be adjusted simultaneously to reduce the RF output power in a greater degree.

Figure 4:
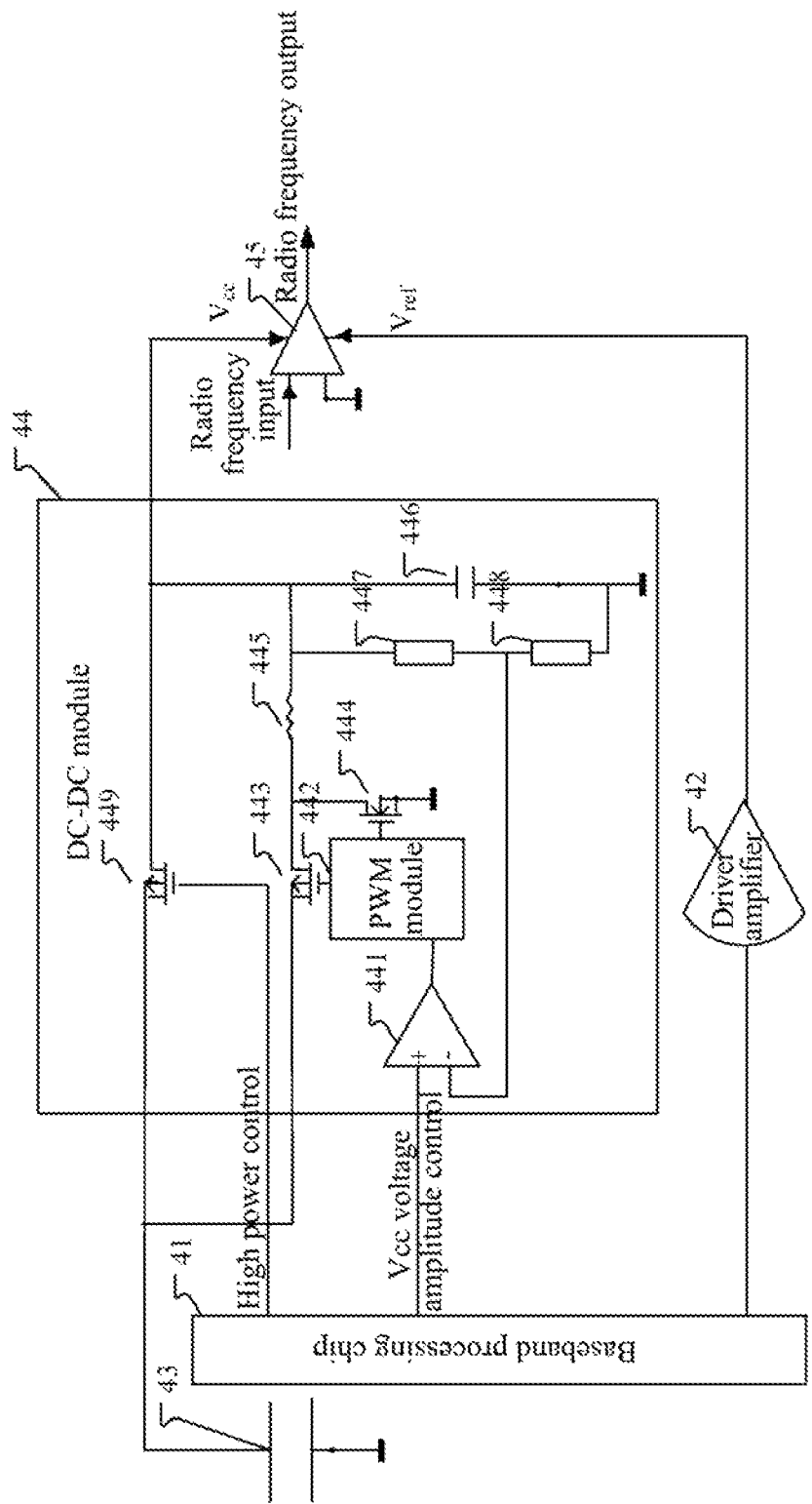
FIG. 4 is a structural schematic diagram of the other circuit for reducing radio frequency power consumption of the mobile phone of the invention.

FIG. 4 is a structural schematic diagram of another circuit for reducing radio frequency power consumption of the mobile phone according to the invention, and as shown in FIG. 4, another circuit for reducing radio frequency power consumption of the mobile phone according to the invention comprises: a baseband processing chip 41, a driver amplifier 42, a battery 43, a DC-DC module 33 and a RF power amplifier 45; wherein the baseband processing chip 41 is used to output the base reference voltage to the driver amplifier 42 according to the RF output power of the RF power amplifier 45; and output the amplitude control signal of the collector voltage to the DC-DC module 44 according to the RF output power of the RF power amplifier 45;

the driver amplifier 42 is used to configure a gain for the base reference voltage which is output from the baseband processing chip 41 and then output the base reference voltage to the base of the RF power amplifier 45;

the battery 43 is used to supply power to the DC-DC module 44;

the DC-DC module 44 is used to implement DC-DC step-down conversion on the voltage of the battery according to the amplitude control signal of the collector voltage which is from the baseband processing chip 41, and then output the voltage of the battery to the collector of the RF power amplifier 45.

As shown in FIG. 4, the DC-DC module 44 generally comprises: a differential amplifier 441, a PWM module 442, a P-FET 443 which is directly connected with the PWM module, a N-FET 444 which is directly connected with the PWM module, an energy storage inductor 445, a voltage stabilizing filtering capacitor 446, a resistor 447 and a resistor 448; wherein the baseband processing chip 41 specifically outputs the collector reference voltage to the in-phase input end of the differential amplifier 441, and the output end of the differential amplifier 441 connects with the PWM module 442; the PWM module 442 connects with the gates of P-FET 443 and N-FET 444; the source of P-FET 443 connects with the battery 43, the drain of P-FET 443 connects with one end of the energy storage inductor 445, the drain of N-FET 444 connects with the drain of P-FET 443, and the source of N-FET 444 is grounding; the other end of the energy storage inductor 445 connects with one end of the voltage stabilizing filtering capacitor 446, and the other end of the voltage stabilizing filtering capacitor 446 is grounding; and the cascaded resistors 447 and 448 are connected at both ends of the voltage stabilizing filtering capacitor 446 in parallel, and the voltage between the resistor 447 and the resistor 448 is output to the anti-phase input end of the differential amplifier 441. The step-down conversion principle of the DC-DC module refers to the related art, which will not be described in detail herein.

The baseband processing chip 41 is also used to output a high power control signal to the DC-DC module 44;

the DC-DC module 44 is further used to directly output the voltage which is supplied by the battery 43 to the collector of the RF power amplifier 45 according to the high power control signal.

As shown in FIG. 4, in addition to the P-FET 443, the DC-DC module also comprises a P-FET 449, of which the gate connects with the baseband processing chip and the source connects with the battery 43. Generally, a high power control threshold is configured in a mobile phone, and when the voltage of the battery 43 is lower than the high power control threshold, the baseband processing chip 41 will output a high power control signal to the P-FET 449 and the P-FET 449 is in a conducting state, and thereby directly outputting the voltage which is supplied by the battery to the collector of the RF power amplifier 45; when the voltage of the battery 43 is not lower than the high power control threshold, the baseband processing chip 41 will not output the high power control signal to the P-FET 449 and the P-FET 449 is cutoff, and therefore, the voltage which is supplied by the battery 43 will be performed the step-down conversion and then output to the collector of RF power amplifier 45.

Figure 5:
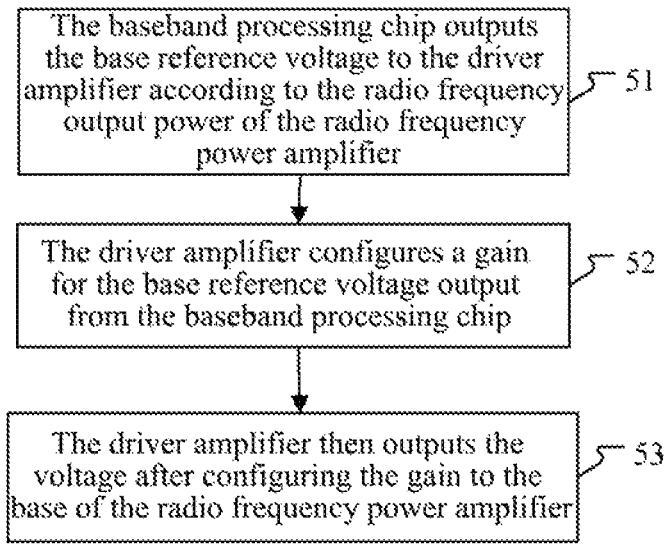
FIG. 5 is a flow schematic diagram of the processing corresponded to the circuit for reducing radio frequency power consumption of the mobile phone shown in FIG. 2.

FIG. 5 is a flow schematic diagram of the processing corresponding to the circuit for reducing radio frequency power consumption of the mobile phone shown in FIG. 2, and as shown in FIG. 5, the flow of the processing corresponding to the circuit for reducing radio frequency power consumption of the mobile phone according to the invention shown in FIG. 2 comprises following steps.

Step 51: the baseband processing chip outputs the base reference voltage to the driver amplifier according to the RF output power of the RF power amplifier.

Herein, the baseband processing chip generally adjusts the $V_{ref}$ by an inner digital analog converter (DAC). In the adjustment, it needs to be ensured that the linear index and ACPR of the RF power amplifier should meet the requirements of the specification. In practical applications, a minimum $V_{ref}$ voltage supporting each level of RF output power can be given according to test data through multiple tests, and the baseband processing chip of the RF power amplifier can be used to dynamically control the $V_{ref}$ in the premise that the $V_{ref}$ is not lower than the given minimum $V_{ref}$ voltage supporting each level of RF output power. Besides, another simpler way can also be adopted, that is, the hierarchical control structure, for example, when simply adopting two level $V_{ref}$ control structure, it can be configured that the low power mode corresponds to a condition of RF output power less than 10 dBm and the high power mode corresponds to a condition of RF output power greater than 10 dBm, and the low power mode and the high power mode respectively correspond to respective base bias reference voltages, so that the RF power amplifier can control its RF output power in the corresponding mode.

Step 52: the driver amplifier configures a gain for the base reference voltage output from the baseband processing chip.

Step 53: the driver amplifier then outputs the voltage that is configured with a gain configuration to the base of the RF power amplifier.

Figure 6:
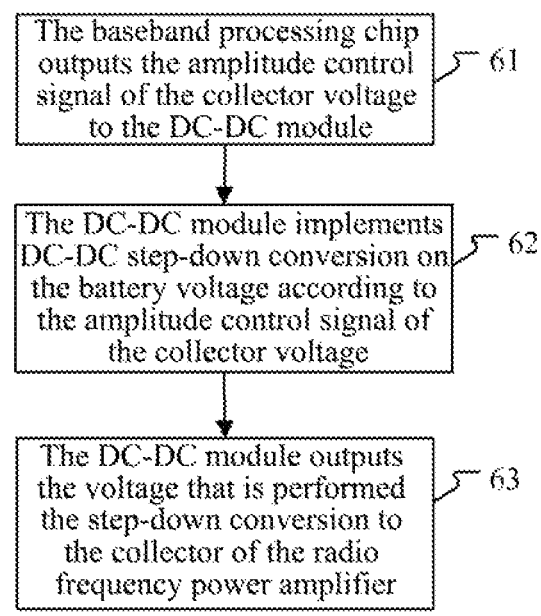
FIG. 6 is a flow schematic diagram of the processing corresponded to the circuit for reducing radio frequency power consumption of the mobile phone shown in FIG. 3.

FIG. 6 is a flow schematic diagram of the processing corresponding to the circuit for reducing radio frequency power consumption of the mobile phone shown in FIG. 3, and as shown in FIG. 6, the flow of the processing corresponding to the circuit for reducing radio frequency power consumption of the mobile phone according to the invention shown in FIG. 3 comprises following steps.

Step 61: the baseband processing chip outputs the amplitude control signal of the collector voltage to the DC-DC module according to the RF output power of the RF power amplifier.

Test data show that the mobile phone can always keep normal communication with the base station in a condition of reducing bias of the RF power amplifier collector (as low as 0.6V), and therefore, a specially designed efficient DC-DC module is adopted to provide the changing bias voltage for the collector of the RF power amplifier and the same time when it is ensured that the communication between the mobile phone and a base station is maintained and the linear index and the ACPR of the RF power amplifier meet the requirements of the specification.

Step 62: the DC-DC module implements DC-DC step-down conversion on the voltage of the battery according to the amplitude control signal of the collector voltage from the baseband processing chip.

Herein, when implementing the DC-DC step-down conversion to on the voltage of the battery, the DC-DC module must be able to quickly respond to the control signal and to control the collector voltage of the RF power amplifier. Generally, the output voltage of the DC-DC module should reach 90% of its target voltage within 30 ms to follow the analog control voltage of the baseband processing chip, that is, the change of the amplitude control signal of the collector voltage, and the DC-DC module generally works at a higher switching frequency so as to reduce the physical size of the inductor.

Step 63: the DC-DC module outputs the voltage that is performed step-down conversion to the collector of the RF power amplifier.

Of course, the bias voltage and collector bias voltage can also be simultaneously adjusted to reduce the RF output power of the RF power amplifier, and the adjustment order of the base bias voltage and the collector bias voltage is not limited.

In order to ensure a high power output at a low battery voltage, that is, in order to supply 28 dBm RF output power in the premise of ensuring the linear index of the RF power amplifier, the RF power amplifier manufacturer recommends that the minimum voltage of $V_{cc}$ should be 3.4V. In order to maintain 35% PAE at the 3.4V voltage, the current of the collector of the RF power amplifier should reach 530 m. The principle of obtaining the data is as follows:

28 dBm RF output power: $10^{2.8}$ mW=631 mW the required power of the RF power amplifier ($V_{cc} \times I_{cc}$) is: 631 mW/(PAE/100)=1803 mW the required $I_{cc}$ for 3.4V $V_{cc}$ is: $I_{cc}$=1803 mW/3.4V=530 mA in order to ensure 3.4V$_{cc}$ and 530 mA $I_{cc}$, the DC-DC module requires a certain margin between the input voltage and the output voltage, if the on-resistance of the p-channel MOSFET (P-FET) inside the DC-DC module and connecting with the pulse width modulation module is 0.4Ω and the inductor resistance is 0.1Ω, then the voltage difference produced by the cascaded elements is: (0.4Ω+0.1Ω)×530 mA=265 mV, when the voltage of the battery is reduced below 3.665V, the DC-DC converter will be unable to support the output of 3.4V, and in this case, it is best to directly short the collector of the RF power amplifier with the battery so as to take full use of the energy of the Li+ battery.

Generally, a bypass P-FET is connected in parallel with the both ends of P-FET inside the energy storage inductor and DC-DC module and connecting with the PMW module. The bypass P-FET (built-in or built-out) directly connects the voltage of the battery to the collector of the RF power amplifier in the high power mode, and the bypass measure is necessary for solving the problem of the high RF output power and the low voltage of the battery.

A preferred scheme for optimizing PAE is to continuously adjust the collector bias of the RF power amplifier, and such a scheme requires factory calibration and debugging software to ensure that the RF power amplifier has the good linearity and ACPR index when the collector bias continuously changes. Another compromise scheme is to configure the bias voltage in accordance with a plurality of levels, usually 2 levels or 4 levels. For example, as for a bias configuration system with 4 levels, the $V_{cc}$ voltage may be configured to: Vbatt (the voltage of the battery), 1.5V, 1.0V and 0.6V. The overall efficiency of the system approximates to the system efficiency of continuously controlling the collector bias of the RF power amplifier. As for the low-power and medium power mode, the inductor just needs to support a peak current lower than 150 mA.

The above description is just the preferred examples of the present invention, which is not used to limit the protection scope of the present invention.

What is claimed is:

1. A circuit for reducing radio frequency power consumption of a mobile phone, comprising: a baseband processing chip and a radio frequency power amplifier, wherein the baseband processing chip is used to adjust a collector bias voltage of the radio frequency power amplifier according to radio frequency output power of the radio frequency power amplifier;

wherein the circuit further comprises a battery and a DC-DC module;

the battery is used to supply power for the DC-DC module;

the baseband processing chip is used to output an amplitude control signal of a collector voltage to the DC-DC module according to the radio frequency output power of the radio frequency power amplifier;

the DC-DC module is used to implement DC-DC step-down conversion according to the amplitude control signal of the collector voltage from the baseband processing chip, and then output to a collector of the radio frequency power amplifier;

the radio frequency power amplifier is used to amplify a radio frequency input, and then output the radio frequency input that is amplified.

2. The circuit according to claim 1 wherein the baseband processing chip is further used to adjust a base bias voltage of the radio frequency power amplifier according to the radio frequency output power of the radio frequency power amplifier;

wherein the circuit further comprises a driver amplifier;

the baseband processing chip is further used to output a base reference voltage to the driver amplifier according to the radio frequency output power of the radio frequency power amplifier;

the driver amplifier is used to configure a gain for the base reference voltage output from the baseband processing chip, and then output the base reference voltage to a base of the radio frequency power amplifier.

3. The circuit according to claim 2, wherein, the baseband processing chip is further used to output a high power control signal to the DC-DC module;

the DC-DC module is further used to directly output the voltage that is supplied by the battery to the collector of the radio frequency power amplifier according to the high power control signal.

4. The circuit according to claim 1, wherein the baseband processing chip is further used to output a high power control signal to the DC-DC module;

the DC-DC module is further used to directly output a voltage that is supplied by the battery to the collector of the radio frequency power amplifier according to the high power control signal.

5. A method for reducing radio frequency power consumption of a mobile phone, comprising: a baseband processing chip adjusting a collector bias voltage of a radio frequency power amplifier according to radio frequency output power of the radio frequency power amplifier;

wherein the baseband processing chip adjusting the collector bias voltage of the radio frequency power amplifier according to the radio frequency output power of the radio frequency power amplifier comprises:

the baseband processing chip outputting an amplitude control signal of a collector voltage to a DC-DC module according to the radio frequency output power of the radio frequency power amplifier; and the DC-DC module implementing DC-DC step-down conversion on a voltage of a battery according to the amplitude control signal of the collector voltage from the baseband processing chip, and then outputting the voltage of the battery to a collector of the radio frequency power amplifier.

6. The method according to claim 5, further comprising: the baseband processing chip further adjusting a base bias voltage of the radio frequency power amplifier according to the radio frequency output power of the radio frequency power amplifier;

wherein the baseband processing chip adjusting the base bias voltage of the radio frequency power amplifier according to the radio frequency output power of the radio frequency amplifier comprises:

the baseband processing chip outputting a base reference voltage to a driver amplifier according to the radio frequency output power of the radio frequency power amplifier; and the driver amplifier configuring a gain for the base reference voltage output from the baseband processing chip, and outputting the base reference voltage to a base of the radio frequency power amplifier.

7. The method according to claim 6, further comprising: configuring a high power control threshold, and the baseband processing chip implementing high power control on the radio frequency power amplifier, which specifically comprises:

when a voltage of a battery is lower than the high power control threshold, the baseband processing chip outputting a high power control signal to a DC-DC module; and the DC-DC module directly outputting the voltage which is supplied by the battery to a collector of the radio frequency power amplifier according to the high power control signal.

8. The method according to claim 5, further comprising: configuring a high power control threshold, and the baseband processing chip implementing high power control on the radio frequency power amplifier, which specifically comprises:

when a voltage of a battery is lower than the high power control threshold, the baseband processing chip outputting a high power control signal to a DC-DC module; and the DC-DC module directly outputting the voltage which is supplied by the battery to a collector of the radio frequency power amplifier according to the high power control signal.

* * * * *